United States Patent
Imai et al.

(10) Patent No.: US 10,855,052 B2
(45) Date of Patent: Dec. 1, 2020

(54) OPTICAL DEVICE

(71) Applicant: Mitsubishi Electric Corporation, Tokyo (JP)

(72) Inventors: Yudai Imai, Tokyo (JP); Norio Okada, Tokyo (JP); Shinichi Kaneko, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/346,911

(22) PCT Filed: Nov. 29, 2016

(86) PCT No.: PCT/JP2016/085399
§ 371 (c)(1),
(2) Date: May 2, 2019

(87) PCT Pub. No.: WO2018/100634
PCT Pub. Date: Jun. 7, 2018

(65) Prior Publication Data
US 2020/0059065 A1 Feb. 20, 2020

(51) Int. Cl.
*H01S 5/026* (2006.01)
*H01S 5/22* (2006.01)
(Continued)

(52) U.S. Cl.
CPC .......... *H01S 5/0265* (2013.01); *H01S 5/2228* (2013.01); *H04B 10/5051* (2013.01); *G02F 2001/0157* (2013.01)

(58) Field of Classification Search
CPC .... H01S 5/0265; H01S 5/2228; H01S 5/0085; H01S 5/0427; H01S 5/06213;
(Continued)

(56) References Cited

U.S. PATENT DOCUMENTS

2004/0101316 A1   5/2004  Naoe et al.
2009/0147352 A1*  6/2009  Marsh ................. G02F 1/01708
                                                              359/344
(Continued)

FOREIGN PATENT DOCUMENTS

CN    104518426 A    4/2015
EP    1 130 708 A1   9/2001
(Continued)

OTHER PUBLICATIONS

International Search Report; Written Opinion; and Notification of Transmittal of the International Search Report and the Written Opinion of the International Searching Authority, or the Declaration issued in PCT/JP2016/085399; dated Mar. 7, 2017.
(Continued)

*Primary Examiner* — Armando Rodriguez
(74) *Attorney, Agent, or Firm* — Studebaker & Brackett PC

(57) ABSTRACT

A semiconductor laser (1) emits laser light. An electro-absorption optical modulator (2) modulates the laser light. The electro-absorption optical modulator (2) includes a plurality of electro-absorption regions (2a, 2b, 2c) having different extinction characteristics, whereby the extinction ratio curve of the optical device can be controlled to have a shape with multiple steps that is suited to driving conditions.

8 Claims, 7 Drawing Sheets

(51) Int. Cl.
  *H04B 10/50* (2013.01)
  *G02F 1/015* (2006.01)
(58) Field of Classification Search
  CPC ............ H01S 5/06216; H01S 5/06226; H01S 5/06251; H01S 5/06253; H01S 5/06256; H01S 5/06258; H04B 10/5051; G02F 2001/0157
  See application file for complete search history.

(56) References Cited

U.S. PATENT DOCUMENTS

2015/0093115 A1    4/2015  Uchiyama et al.
2016/0365929 A1*  12/2016  Nakamura ............. H04B 10/54

FOREIGN PATENT DOCUMENTS

| JP | 2001-221985 A | 8/2001 |
| JP | 2005-142230 A | 6/2005 |
| JP | 2006-242975 A | 9/2006 |
| JP | 2009-053553 A | 3/2009 |
| JP | 2015-068918 A | 4/2015 |
| JP | 2016-092124 A | 5/2016 |

OTHER PUBLICATIONS

An Office Action mailed by the Chinese Patent Office dated Jun. 24, 2020, which corresponds to Chinese Patent Application No. 201680091128.0 and is related to U.S. Appl. No. 16/346,911.

* cited by examiner

OPTICAL DEVICE

FIELD

The present invention relates to an optical device including a semiconductor laser emitting laser light and an electro-absorption optical modulator modulating the laser light.

BACKGROUND

Electro-absorption optical modulator integrated lasers having a semiconductor laser and an electro-absorption optical modulator formed on a single semiconductor substrate have been used as optical devices. In the conventional optical device, one electro-absorption region is provided for one semiconductor laser (see, for example, FIG. 1 of PTL 1).

CITATION LIST

Patent Literature

[PTL 1] Japanese Patent Application Laid-open No. 2016-92124

SUMMARY

Technical Problem

The conventional optical device has an extinction ratio curve that is defined by the extinction characteristic of the one electro-absorption region, and therefore the curve cannot be controlled to be suited to driving conditions for driving the optical device. This led to the problem that the overall quality of communications that use the optical device was deteriorated. For high capacity optical communications using an optical device driven by a four-level pulse-amplitude-modulation scheme, in particular, the S/N ratio is lowered due to the increase of signal levels from two to four, which adversely affects and deteriorates the quality of communications. With four levels of signals, the sensitivity to drive voltage is also increased, which makes it hard to achieve consistency in the quality of communications.

The present invention was made to solve the problem described above and it is an object of the invention to provide an optical device configured to enable control of the extinction ratio curve to have a shape suited to driving conditions.

Solution to Problem

An optical device according to the present invention includes: a semiconductor laser emitting laser light; and an electro-absorption optical modulator modulating the laser light, wherein the electro-absorption optical modulator includes a plurality of electro-absorption regions having different extinction characteristics.

Advantageous Effects of Invention

In the present invention, the electro-absorption optical modulator includes a plurality of electro-absorption regions having different extinction characteristics, whereby the extinction ratio curve of the optical device can be controlled to have a shape with multiple steps that is suited to driving conditions.

DESCRIPTION OF EMBODIMENTS

An optical device according to the embodiments of the present invention will be described with reference to the drawings. The same components will be denoted by the same symbols, and the repeated description thereof may be omitted.

Embodiment 1

Figure 1:
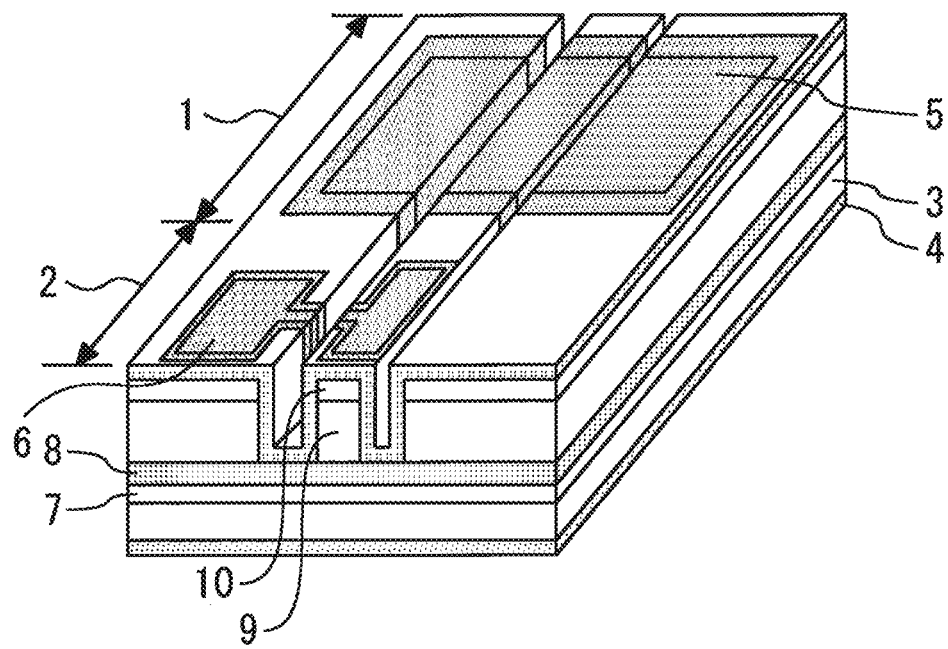
FIG. 1 is a perspective view illustrating an optical device according to Embodiment 1 of the present invention.

FIG. 1 is a perspective view illustrating an optical device according to Embodiment 1 of the present invention. This optical device is an electro-absorption optical modulator integrated laser having a semiconductor laser 1 and an electro-absorption optical modulator 2 formed on a single n-type InP substrate 3. The semiconductor laser 1 emits laser light when a voltage is applied to an n-electrode 4 on the backside and to an electrode 5 on the front side. The electro-absorption optical modulator 2 modulates the laser light by application of a modulated voltage to the n-electrode 4 and a p-electrode 6.

The electro-absorption optical modulator 2 includes an n-type InP cladding layer 7, a light absorption layer 8, a p-type InP cladding layer 9, a p-type contact layer 10, and the p-electrode 6 which are formed successively on the n-type InP substrate 3. The light absorption layer 8 has a multi-quantum-well (MQW) layer configured by alternately stacking multiple layers of i-InGaAsP or i-AlGaInAs with different composition ratios as barrier layers and well layers. Here, "i-" represents an undoped layer.

Figure 2:
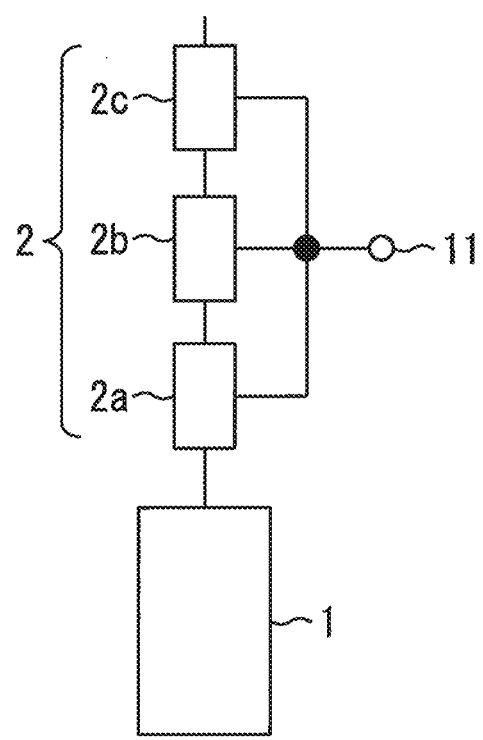
FIG. 2 is a block diagram illustrating the optical device according to Embodiment 1 of the present invention.

FIG. 2 is a block diagram illustrating the optical device according to Embodiment 1 of the present invention. The electro-absorption optical modulator 2 includes three electro-absorption regions 2a, 2b, and 2c having different extinction characteristics. The electro-absorption regions 2a, 2b, and 2c are connected in series to modulate laser light successively. The extinction characteristics of the electro-absorption regions 2a, 2b, and 2c can be controlled by adjusting parameters of the multi-quantum-wells in the light absorption layer, such as, the numbers or thicknesses of well layers and barrier layers, during production. A modulated voltage is applied to the three electro-absorption regions 2a, 2h, and 2c via a single common terminal 11.

Figure 3:
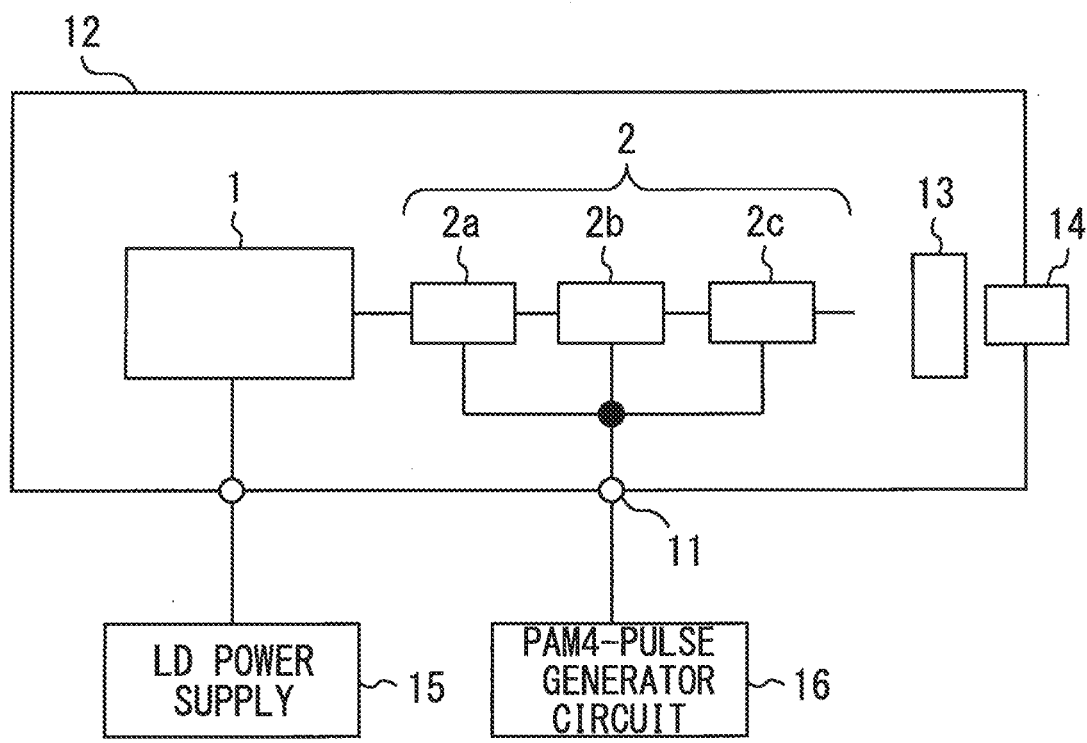
FIG. 3 is a block diagram illustrating optical module according to Embodiment 1 of the present invention.

FIG. 3 is a block diagram illustrating an optical module according to Embodiment 1 of the present invention. The optical module 12 includes the semiconductor laser 1, the electro-absorption optical modulator 2, a lens 13, and a connector 14. An LD power supply 15 supplies power to the semiconductor laser 1. A driver 16 is a PAM4 pulse generator circuit that generates a pulse signal using a four-level pulse-amplitude-modulation scheme for driving the electro-absorption optical modulator 2 based on the four-level pulse-amplitude-modulation scheme. The output light from the electro-absorption optical modulator 2 is collected by the lens 13 and introduced into an optical fiber connected to the connector 14.

Figure 4:
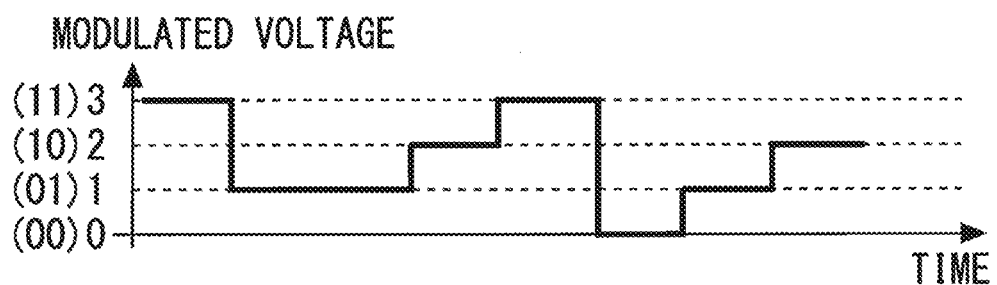
FIG. 4 is a diagram showing modulated voltage levels of the four-level pulse-amplitude-modulation (PAM4) scheme.

FIG. 4 is a diagram showing modulated voltage levels of the four-level pulse-amplitude-modulation (PAM4) scheme. The four-level pulse-amplitude-modulation is a technique whereby a bit sequence represented by "0" and "1" is modulated and transmitted as a pulse signal having four voltage levels represented by two bits "0" and "1" (such as four levels represented by "00", "01", "10", and "11").

Next, a method of manufacturing the electro-absorption optical modulator 2 according to this embodiment will be described. First, the electro-absorption region 2a is formed in accordance with a typical manufacturing method of electro-absorption optical modulator integrated lasers. Next, after removing a region where the electro-absorption region 2h is to be formed by etching, the electro-absorption region 2b is grown epitaxially. Next, after removing a region where the electro-absorption region 2c is to be formed by etching, the electro-absorption region 2c is grown epitaxially.

Figure 5:
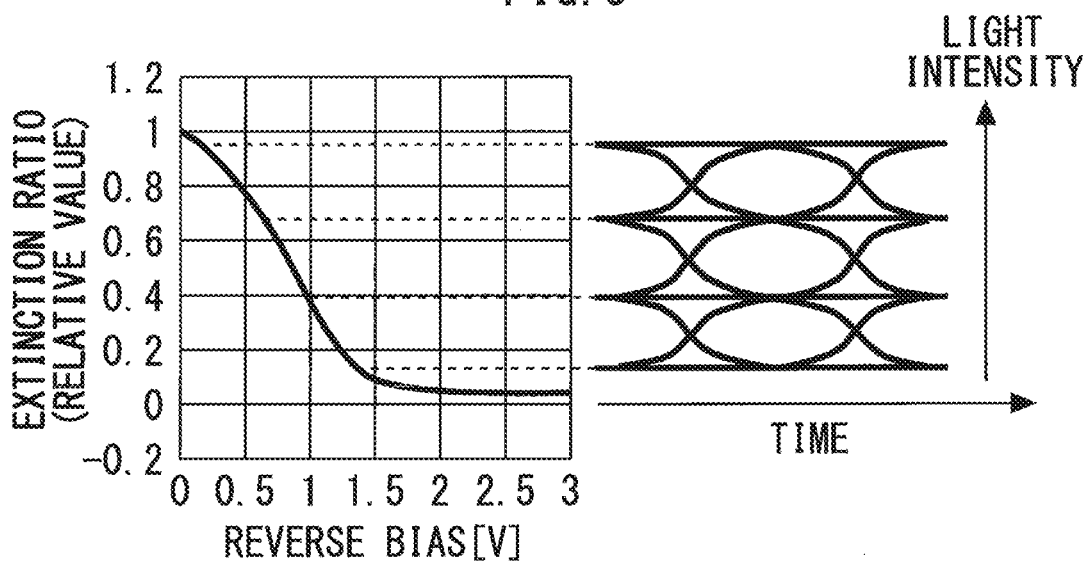
FIG. 5 is a graph showing an extinction characteristic and a light output waveform of a common electro-absorption optical modulator.

Next, the extinction characteristic of the electro-absorption optical modulator according to this embodiment will be described in comparison to that of a common configuration. FIG. 5 is a graph showing an extinction characteristic and a light output waveform of a common electro-absorption optical modulator. Application of a reverse bias to the electro-absorption optical modulator reduces the amount of emitted laser light. The extinction ratio refers to the ratio of laser light intensities when a reverse bias is applied and when the reverse bias is zero.

Figure 6:
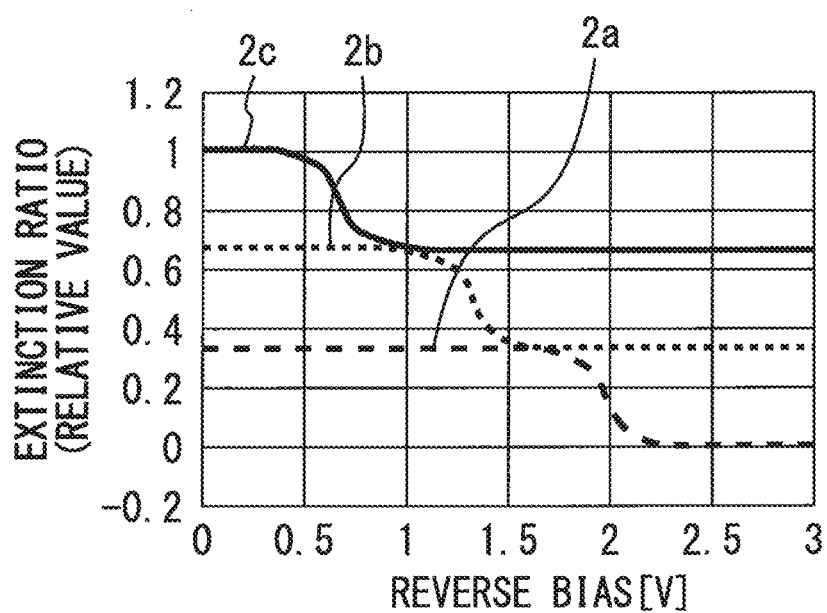
FIG. 6 is a graph showing extinction characteristics of the three electro-absorption regions according to Embodiment 1 of the present invention.
Figure 7:
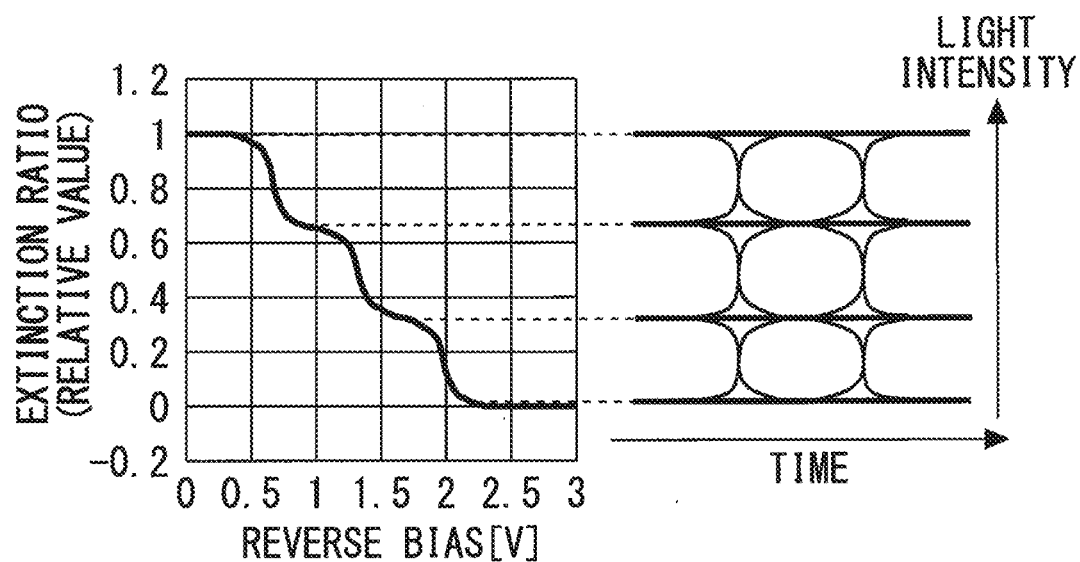
FIG. 7 is a graph showing the extinction characteristic and light output waveform of the electro-absorption optical modulator according to Embodiment 1 of the present invention.

FIG. 6 is a graph showing extinction characteristics of the three electro-absorption regions according to Embodiment 1 of the present invention. FIG. 7 is a graph showing the extinction characteristic and light output waveform of the electro-absorption optical modulator according to Embodiment 1 of the present invention. By synthesizing the extinction characteristics of the three electro-absorption regions 2a, 2h, and 2c shown in FIG. 6, an extinction characteristic including a plurality of inflection points, i.e., a plurality of steps, such as the one shown in FIG. 7, which is extremely difficult to realize with a single electro-absorption region configuration, can be achieved.

Voltage transitions between the high and the low voltage, i.e., the rising and falling edges of the light output waveform output from the electro-absorption optical modulator 2 are largely affected by the slope of the extinction characteristic. An electro-absorption optical modulator having a typical extinction characteristic and driven by a PAM4 scheme would have a light output waveform such as the one shown on the right side of FIG. 5. On the other hand, the electro-absorption optical modulator 2 of this embodiment has an extinction characteristic with drastic changes in the area of use so that its light output waveform appears as shown on the right side of FIG. 7. Thus a certain eye opening (mask margin) can be secured in each of the three layer waveforms.

As described above, according to this embodiment, the electro-absorption optical modulator 2 includes a plurality of electro-absorption regions 2a, 2b, and 2c having different extinction characteristics, whereby the extinction ratio curve of the optical device can be controlled to have a shape with multiple steps that is suited to driving conditions.

If the number of the plurality of electro-absorption regions is three, the extinction ratio curve can be controlled to have a shape suited to a four-level pulse-amplitude-modulation scheme as shown on the left side of FIG. 7. This way, the communication quality can be improved and stabilized. Consequently, an optical device suitable for communications with an increased capacity by the use of multiple levels of signals can be provided.

Embodiment 2

Figure 8:
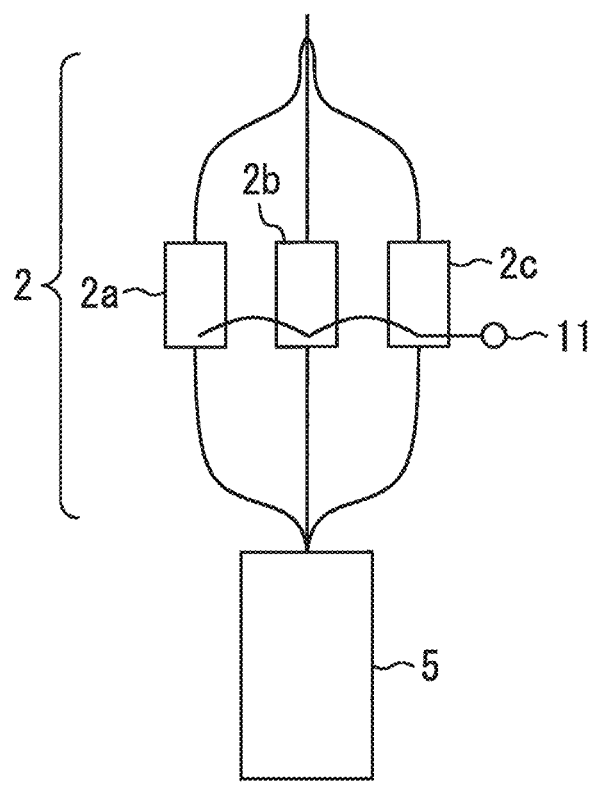
FIG. 8 is a block diagram illustrating an optical device according to Embodiment 2 of the present invention.

FIG. 8 is a block diagram illustrating an optical device according to Embodiment 2 of the present invention. Three electro-absorption regions 2a, 2b, and 2c are connected in parallel for one semiconductor laser 1. The electro-absorption regions 2a, 2b, and 2c each modulate laser light, and the outputs of the electro-absorption regions 2a, 2b, and 2c are synthesized. A modulated voltage is applied to the three electro-absorption regions 2a, 2b, and 2c via a single common terminal 11.

Figure 9:
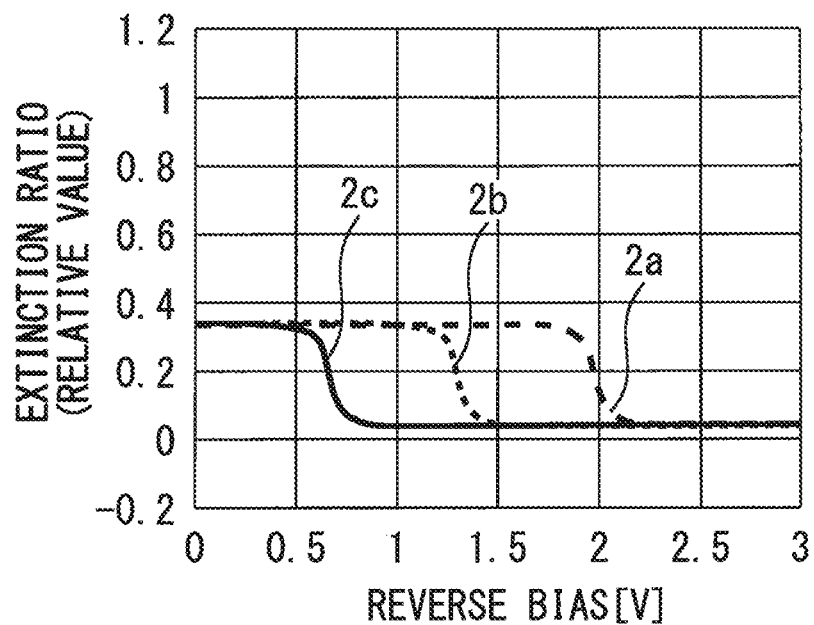
FIG. 9 is a graph showing the extinction characteristics of the three electro-absorption regions according to Embodiment 2 of the present invention.

FIG. 9 is a graph showing the extinction characteristics of the three electro-absorption regions according to Embodiment 2 of the present invention. The extinction characteristic shown in FIG. 7, which is extremely difficult to realize with one electro-absorption region, can be achieved by synthesizing their extinction characteristics. Thus the same effects as those of Embodiment 1 can be achieved.

Embodiment 3

Figure 10:
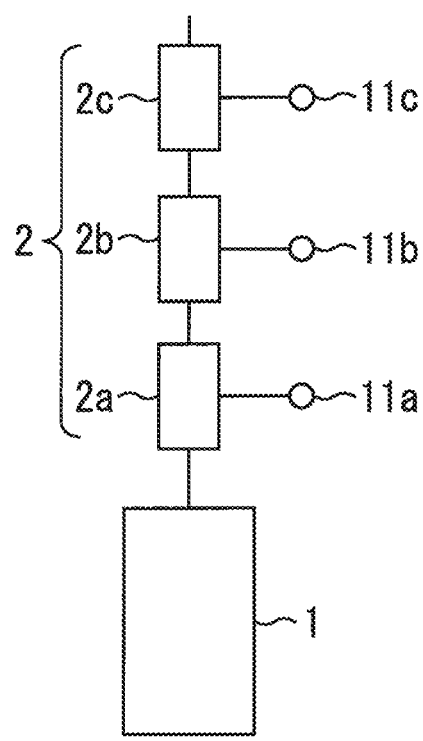
FIG. 10 is a block diagram illustrating an optical device according to Embodiment 3 of the present invention.

FIG. 10 is a block diagram illustrating an optical device according to Embodiment 3 of the present invention. In this embodiment, power supply terminals 11a, 11b, and 11c are provided respectively to three series-connected electro-absorption regions 2a, 2b, and 2c and are powered separately. In this case, each electro-absorption region requires one driver. With the electro-absorption regions being individually driven by their drivers, the driving conditions can be adjusted discretely. An NRZ scheme, which is the currently used Ethernet (registered trademark) technique, can be used as the modulation scheme for each of the regions.

Figure 11:
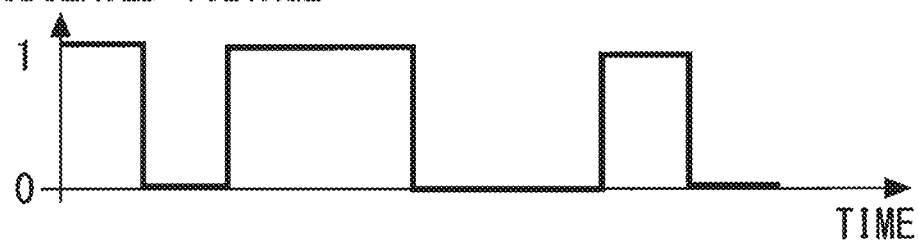
FIG. 11 is a diagram showing modulated voltage levels of the two-level pulse modulation scheme (NRZ scheme).

FIG. 11 is a diagram showing modulated voltage levels of the two-level pulse modulation scheme). Two-level pulse modulation is a technique whereby, a bit sequence represented by "0" and "1" is modulated and transmitted as a pulse signal having two voltage levels, the high and the low voltage. By driving the electro-absorption regions 2a, 2b, and 2c discretely using the NRZ scheme, it is possible to carry out a quasi-four-level pulse-amplitude-modulation wherein driving conditions are discretely adjustable, whereby an improvement of the communication quality is expected.

Figure 12:
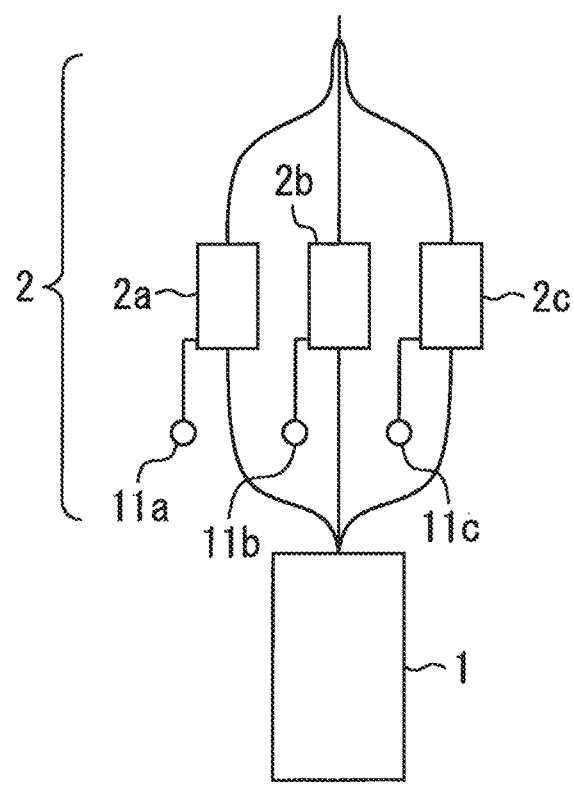
FIG. 12 is a block diagram illustrating a variation example of the optical device according to Embodiment 3 of the present invention.

FIG. 12 is a block diagram illustrating a variation example of the optical device according to Embodiment 3 of the present invention. Power supply terminals 11a, 11b, and 11c are respectively provided for the three parallel-connected electro-absorption regions 2a, 2b, and 2c, and are powered separately. In this case, the same effects as described above can be achieved.

Embodiment 4

Figure 13:
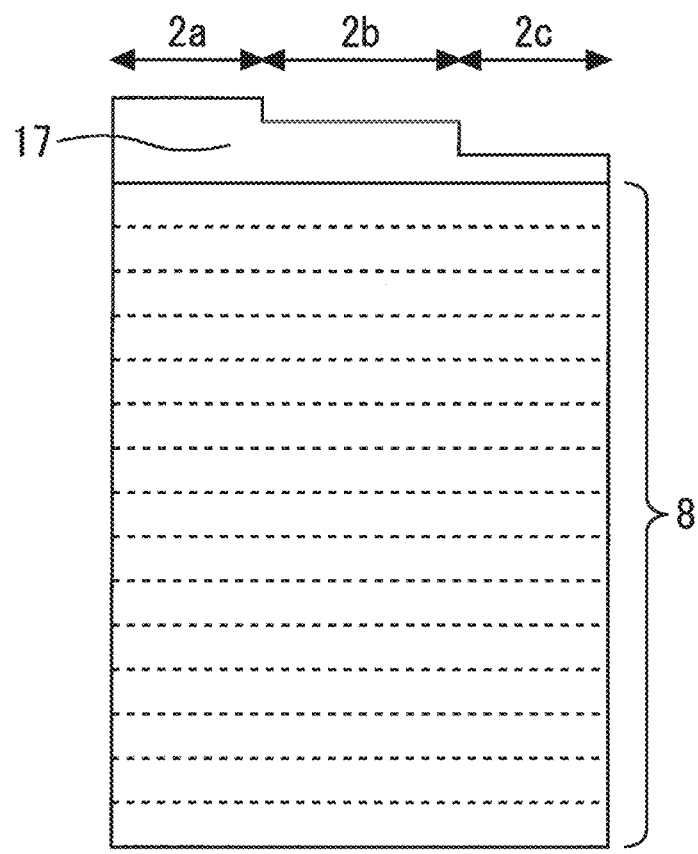
FIG. 13 is a cross-sectional view illustrating three electro-absorption regions according to Embodiment 4 of the present invention.

FIG. 13 is a cross-sectional view illustrating three electro-absorption regions according to Embodiment 4 of the present invention. In this embodiment, after growing the light absorption layer 8 in accordance with a common manufacturing method of electro-absorption optical modulator integrated lasers, an i-InP cladding layer 17 is gown instead of the p-type InP cladding layer 9. The thickness of the i-InP cladding layer 17 is then varied by carrying out etching twice using a photo mask and a photo resist. The parts with different thicknesses of the i-InP cladding layer 17 correspond to the three electro-absorption regions 2a, 2b, and 2c.

This way, in this embodiment, the extinction characteristics of the electro-absorption regions 2a, 2b, and 2c are controlled by varying the thickness of the i-InP cladding layer 17 on the light absorption layer 8 instead of the MQW layer configuration of the light absorption layer 8. Since it is not necessary to perform epitaxial growth multiple times for changing the layer configuration for each of the electro-absorption regions as in Embodiment 1, the burden of wafer processing steps can be significantly reduced. Other structures and effects are the same as those of Embodiment 1.

While the electro-absorption optical modulator 2 has three electro-absorption regions in Embodiments 1 to 4 above, the electro-absorption regions may be provided in any number of two or more. The number of voltage levels used in modulation can be changed from four of the four-level pulse-amplitude-modulation to other numbers in accordance with the number of electro-absorption regions. While examples of electro-absorption optical modulator integrated laser were shown, a combination of a single semiconductor laser and an electro-absorption optical modulator formed on a separate substrate can also be used. The plurality of electro-absorption regions need not necessarily be formed on a single substrate. A plurality of electro-absorption optical modulators formed on separate substrates can be connected and used as the electro-absorption optical modulator.

REFERENCE SIGNS LIST 1 semiconductor laser; 2 electro-absorption optical modulator; 2a,2b,2c electro-absorption region; 3 n-type hid) substrate; 8 light absorption layer; 17 i-InP cladding layer

The invention claimed is:

1. An optical device comprising:
a semiconductor laser emitting laser light; and
an electro-absorption optical modulator modulating the laser light, wherein
the electro-absorption optical modulator includes a plurality of electro-absorption regions having different extinction characteristics,
each of the plurality of electro-absorption regions includes a light absorption layer and an undoped layer provided on the light absorption layer, and
thicknesses of the undoped layers of the plurality of electro-absorption regions are different from each other.

2. The optical device according to claim 1, wherein the plurality of electro-absorption regions are connected in series to modulate the laser light successively.

3. The optical device according to claim 1, wherein the plurality of electro-absorption regions are connected in parallel,
each of the plurality of electro-absorption regions modulates the laser light, and
outputs of the plurality of electro-absorption regions are synthesized.

4. The optical device according to claim 1, wherein each of the plurality of electro-absorption regions is individually driven.

5. The optical device according to claim 1, wherein parameters of multi-quantum-wells in light absorption layers of the plurality of electro-absorption regions are different from each other.

6. The optical device according to claim 1, wherein an extinction ratio curve of the electro-absorption optical modulator has multiple steps.

7. The optical device according to claim 1, wherein the number of the plurality of electro-absorption regions is three, and
the electro-absorption optical modulator is driven by a four-level pulse-amplitude-modulation scheme.

8. The optical device according to claim 1, wherein the optical device is an electro-absorption optical modulator integrated laser, and
the semiconductor laser and the electro-absorption optical modulator are provided on a single semiconductor substrate.

* * * * *